United States Patent
Mendel et al.

(10) Patent No.: US 10,333,535 B1
(45) Date of Patent: Jun. 25, 2019

(54) TECHNIQUES FOR SIGNAL SKEW COMPENSATION

(71) Applicant: Altera Corporation, San Jose, CA (US)

(72) Inventors: David Mendel, Sunnyvale, CA (US);
Carl Ebeling, Redwood City, CA (US);
Dana How, Palo Alto, CA (US);
Mahesh Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 239 days.

(21) Appl. No.: 15/278,409

(22) Filed: Sep. 28, 2016

(51) Int. Cl.
*H03L 7/23* (2006.01)
*H03L 7/099* (2006.01)
*H03L 7/089* (2006.01)
*H03L 7/093* (2006.01)

(52) U.S. Cl.
CPC .............. *H03L 7/23* (2013.01); *H03L 7/0891* (2013.01); *H03L 7/093* (2013.01); *H03L 7/0995* (2013.01)

(58) Field of Classification Search
CPC ......... H03L 7/23; H03L 7/0891; H03L 7/093; H03L 7/0995
USPC ......... 327/144–163, 170, 172–176, 291–299
See application file for complete search history.

(56) References Cited

U.S. PATENT DOCUMENTS

| | | | |
|---|---|---|---|
| 5,880,612 A * | 3/1999 | Kim | H03K 5/133 327/156 |
| 6,075,832 A | 6/2000 | Geannopoulos et al. | |
| 6,686,785 B2 | 2/2004 | Liu et al. | |
| 7,023,252 B2 | 4/2006 | Schultz | |
| 7,095,265 B2 | 8/2006 | Nguyen et al. | |
| 8,205,182 B1 | 6/2012 | Zlatanovici et al. | |
| 8,922,264 B1 | 12/2014 | Chong et al. | |
| 2011/0025391 A1 | 2/2011 | Amrutur et al. | |

OTHER PUBLICATIONS

Vadim Gutnik et al., "Active GHz Clock Network Using Distributed PLLs," IEEE Journal of Solid-State Circuits, vol. 35, No. 11, Nov. 2000, pp. 1553-1560.
U.S. Appl. No. 14/974,506, filed Dec. 18, 2015.

* cited by examiner

*Primary Examiner* — Tomi Skibinski
(74) *Attorney, Agent, or Firm* — Steven J. Cahill

(57) ABSTRACT

An integrated circuit includes a signal network and a phase detector circuit. The signal network includes an adjustable delay circuit. The adjustable delay circuit is coupled at an intersection in the signal network between branches of the signal network. The signal network generates a first signal at a first leaf node of the signal network in response to a second signal. The signal network generates a third signal at a second leaf node of the signal network in response to the second signal. The phase detector circuit compares phases of the first and third signals to generate a phase detection signal. The adjustable delay circuit adjusts a delay provided to the first signal relative to the second signal to reduce a skew between the first and third signals based on the phase detection signal indicating that the first and third signals have the skew.

15 Claims, 5 Drawing Sheets

TECHNIQUES FOR SIGNAL SKEW COMPENSATION

FIELD OF THE DISCLOSURE

The present disclosure relates to electronic circuits, and more particularly, to techniques for compensation of skew between signals.

BACKGROUND

Integrated circuits typically include circuit blocks that are used to implement a variety of functions. When signals need to be transmitted to different circuit blocks within an integrated circuit, the integrated circuit typically includes a clock network to ensure proper synchronization between the different circuit blocks. As data signals are transmitted to different parts of the integrated circuit (IC), clock signals may also be transmitted through a clock network within the integrated circuit to the different circuit blocks. In a synchronous design, clock signal distribution through a balanced clock network ensures that valid data signals are captured at every circuit block (e.g., flip-flops, latches, etc.) that forms part of the IC design.

However, if different clock networks in an IC have different signal propagation characteristics, the clock signals may not arrive at all of the circuit blocks at the same time. For example, a clock signal may be routed through a path with higher or lower resistance, capacitance, or driver strength caused by manufacturing variations that differ from chip-to-chip resulting in clock skew or misalignment.

BRIEF SUMMARY

Various embodiments are disclosed herein for compensating for skew between signals in integrated circuits and circuit systems. According to some embodiments, a circuit system includes first and second clock networks, a phase detector circuit, and a phase-locked or delay-locked loop circuit. The first clock network generates a first clock signal at a first leaf node of the first clock network in response to a second clock signal. The second clock network generates a third clock signal at a second leaf node of the second clock network in response to a fourth clock signal. The phase detector circuit compares phases of the first and third clock signals to generate a phase detection signal. The phase-locked or delay-locked loop circuit generates the second and fourth clock signals. The phase-locked or delay-locked loop circuit adjusts a phase of the second clock signal to reduce a clock skew between the first and third clock signals based on the phase detection signal indicating that the first and third clock signals have the clock skew.

According to other embodiments, an integrated circuit includes a signal network and a phase detector circuit. The signal network includes an adjustable delay circuit. The adjustable delay circuit is coupled at an intersection in the signal network between branches of the signal network. The signal network generates a first signal at a first leaf node of the signal network in response to a second signal. The signal network generates a third signal at a second leaf node of the signal network in response to the second signal. The phase detector circuit compares phases of the first and third signals to generate a phase detection signal. The adjustable delay circuit adjusts a delay provided to the first signal relative to the second signal to reduce a skew between the first and third signals based on the phase detection signal indicating that the first and third signals have the skew.

The various embodiments of the present invention disclosed herein are not mutually exclusive to one another. Two or more of the embodiments disclosed herein may be used together in the same system or device. Embodiments of the present invention can be implemented in numerous ways, such as a process, an apparatus, a system, or a device. Various objects, features, and advantages of the present invention will become apparent upon consideration of the following detailed description and the accompanying drawings.

DETAILED DESCRIPTION

The embodiments disclosed herein include circuitry and methods to compensate for skew between signals in an integrated circuit (IC). It will be apparent to one skilled in the art, that the present exemplary embodiments may be practiced without some or all of the specific details disclosed herein. In other instances, well-known operations have not been described in detail in order not to unnecessarily obscure the present embodiments.

Figure 1:
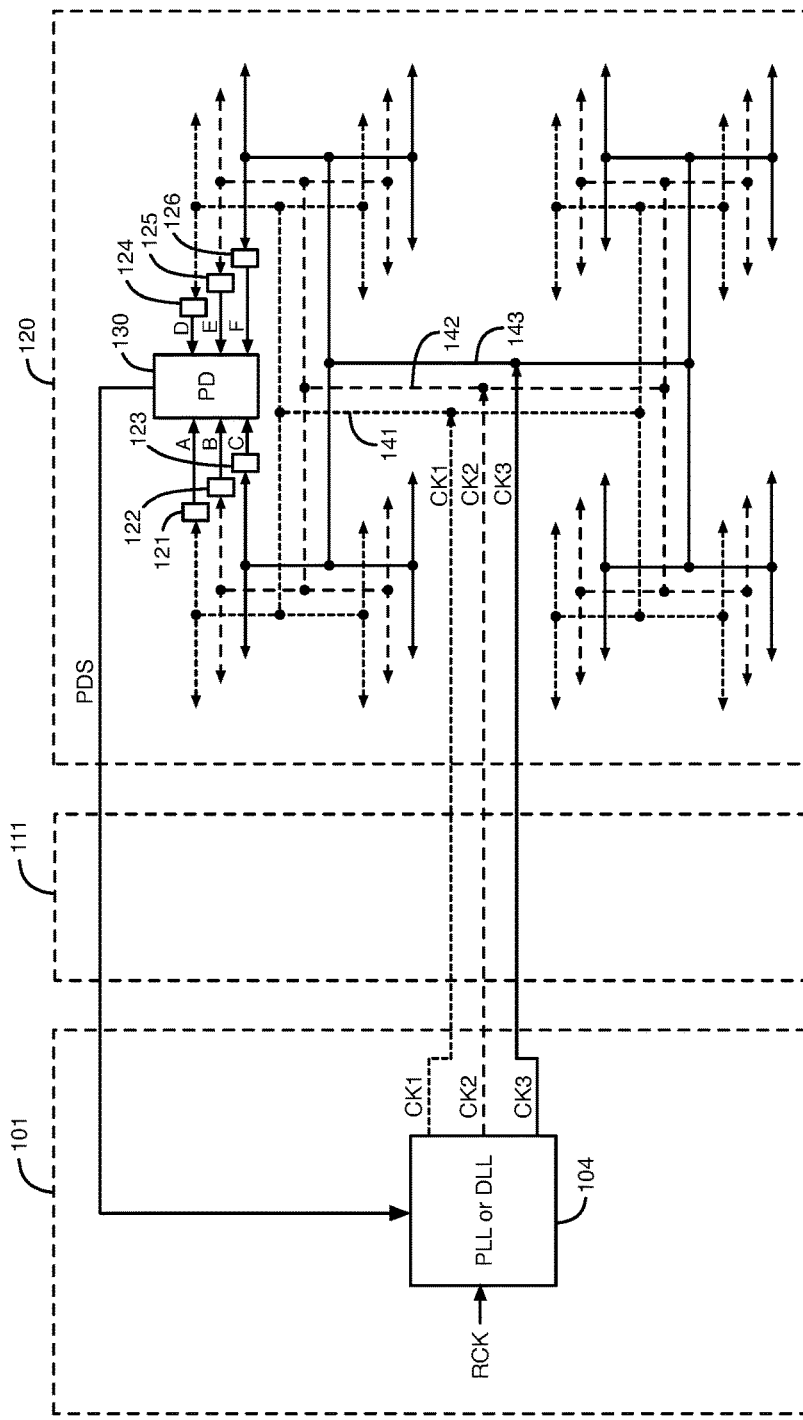
FIG. 1 illustrates an example of a circuit system that adjusts clock skew between clock signals in multiple clock networks in an integrated circuit, according to an embodiment.

FIG. 1 illustrates an example of a circuit system that adjusts clock skew between clock signals in multiple clock networks in an integrated circuit, according to an embodiment. The circuit system of FIG. 1 includes integrated circuit (IC) die 101, medium 111, and integrated circuit (IC) die 120. IC 101 includes a circuit 104 that may be, for example, a phase-locked loop (PLL) circuit or a delay-locked loop (DLL) circuit (referred to herein as PLL/DLL circuit 104). Medium 111 includes various conductors, such as conductive vias and conductive traces. Medium 111 may be, for example, an interposer, a circuit board, a substrate, or another portion of one of the integrated circuit dies 101 or 120. Integrated circuit 120 includes a first clock network 141, a second clock network 142, a third clock network 143, and a phase detector (PD) circuit 130. IC 120 may be any type of IC, such as a programmable logic IC or a microprocessor IC. IC 101 may be, for example, a transceiver IC. Programmable logic ICs include field programmable gate arrays (FPGAs), programmable logic devices (PLDs), and programmable logic arrays (PLAs), to name a few examples.

In the circuit system of FIG. 1, PLL/DLL circuit 104 in IC 101 generates clock signals CK1-CK3 that are provided to the clock networks 141-143, respectively, in IC 120 through conductors in medium 111. Clock signals CK1-CK3 may develop clock skew relative to each other while clock signals CK1-CK3 are being transmitted through conductors having different properties in medium 111. For example, due to manufacturing variations, some conductors (i.e., wires) may have different buffer sizes, resistance, or capacitance, and these variations may change on a chip-by-chip basis. Furthermore, additional variation may exist in the respective clock networks 141, 142, and 143. Phase detector circuit 130 compares the phases of the clock signals at two or more leaf nodes of clock networks 141-143 to generate one or more phase detection signals PDS. Phase detector circuit 130 causes the one or more phase detection signals PDS to indicate a phase offset between the clock signals at the monitored leaf nodes. The one or more phase detection signals PDS are provided to PLL/DLL circuit 104 through one or more conductors in medium 111. PLL/DLL circuit 104 adjusts the phases of one or more of the clock signals CK1-CK3 in response to the one or more phase detection signals PDS to reduce clock skew between two or all three of clock signals CK1-CK3. Further details of the embodiment of FIG. 1 are described below.

PLL/DLL circuit 104 generates three clock signals CK1, CK2, and CK3 in response to a reference clock signal RCK. PLL/DLL circuit 104 and each of the other PLL circuits disclosed herein may, as an example, include a phase frequency detector circuit, a charge pump circuit, a loop filter circuit, a voltage-controlled oscillator (VCO) circuit, and a feedback frequency divider circuit. Each of the three clock signals CK1, CK2, and CK3 is provided through a separate conductor in medium 111 to a respective one of clock networks 141, 142, and 143 in IC 120, as shown in FIG. 1. Clock networks 141-143 overlap as shown in FIG. 1. Clock networks 141 and 142 are shown with dashed lines of two different lengths to more easily distinguish the three clock networks 141-143 from each other in FIG. 1. A clock network may also be referred to as a clock tree. In the embodiment of FIG. 1, clock networks 141-143 are configured as H-tree clock networks. However, the techniques disclosed herein with respect to FIG. 1 may be used with clock networks having other types of architectures. Clock networks 141-143 may be global or local clock networks.

Clock signals CK1, CK2, and CK3 are provided through the respective clock networks 141, 142, and 143 in IC 120 to leaf nodes in the respective clock networks 141, 142, and 143. Leaf nodes are endpoint nodes of a clock network. Leaf nodes may be, for example, coupled to registers, latches, or other types of timing circuits (not shown) at the endpoint nodes of the clock network. Six exemplary leaf nodes 121-126 are shown in FIG. 1. Leaf nodes 121 and 124 are endpoint nodes of clock network 141 that receive clock signal CK1. Leaf nodes 122 and 125 are endpoint nodes of clock network 142 that receive clock signal CK2. Leaf nodes 123 and 126 are endpoint nodes of clock network 143 that receive clock signal CK3.

The clock signals received at the six leaf nodes 121-126 are provided to inputs of phase detector circuit 130. In FIG. 1, the clock signals provided from leaf nodes 121, 122, 123, 124, 125, and 126 to phase detector circuit 130 are shown as signals A, B, C, D, E, and F, respectively. Thus, clock signals A and D are derived from clock signal CK1, clock signals B and E are derived from clock signal CK2, and clock signals C and F are derived from clock signal CK3.

Phase detector circuit 130 compares the phases of two or more of clock signals A, B, C, D, E, and F to generate one or more phase detection signals PDS. Phase detector circuit 130 may cause the phase detection signals PDS to indicate a phase offset between the two or more monitored clock signals A-F. Phase detector 130 may cause the phase detection signals PDS to indicate which of the monitored clock signals A-F has a phase that is leading the phases of the one or more other monitored clock signals. Phase detector circuit 130 varies the phase detection signals PDS based on any change in which of the monitored clocks signals A-F is leading the phase or phases of the other monitored clock signals A-F. As an example, the phase detector 130 may adjust the PDS signals in response to a change from the phase of clock signal A leading the phase of clock signal B to the phase of clock signal B leading the phase of clock signal A.

Phase detector circuit 130 and other phase detector circuits disclosed herein may be implemented by any suitable type of phase detector. As an example, phase detector circuit 130 may use a long term averaging technique to determine any phase offset between the two or more monitored clock signals A-F, because the delay of phase detection signals PDS is not time critical. As another example, phase detector circuit 130 may include a bang-bang phase detector. As yet another example, phase detector circuit 130 may use one of the phase detection techniques using registers in pipelined stages that are disclosed in commonly-assigned U.S. patent application Ser. No. 14/974,506, filed Dec. 18, 2015, which is incorporated by reference herein in its entirety. In some embodiments, phase detector circuit 130 may include two, three, four, or more phase detector circuits.

Phase detector circuit 130 can compare the phases of clock signals derived from leaf nodes of two different clock networks to generate the one or more phase detection signals PDS. For example, phase detector circuit 130 can compare the phase of clock signal A from clock network 141 to the phase of clock signal E from clock network 142 (or to the phase of clock signal F from clock network 143) to generate a first subset of the phase detection signals PDS. Phase detector circuit 130 can compare the phase of clock signal B from clock network 142 to the phase of clock signal F from clock network 143 (or to the phase of clock signal D from clock network 141) to generate a second subset of the phase detection signals PDS. Phase detector circuit 130 can compare the phase of clock signal C from clock network 143 to the phase of clock signal D from clock network 141 (or to the phase of clock signal E from clock network 142) to generate a third subset of the phase detection signals PDS.

In some embodiments, phase detector circuit 130 may also be able to compare the phases of clock signals derived from leaf nodes of three different clock networks to generate phase detection signals PDS. As an example, phase detector circuit 130 may be able to compare the phase of clock signal A from clock network 141 to the phase of clock signal E from clock network 142 and to the phase of clock signal F from clock network 143 to generate phase detection signals PDS.

Phase detector circuit 130 causes the value or values of the one or more phase detection signals PDS to indicate which of the two or more monitored clock signals A, B, C, D, E, or F has a phase that is leading the phases of the other monitored clock signals. A phase offset between the two or more monitored clock signals A-F may indicate a clock skew between the monitored clock signals, depending on the desired phase relationship between the monitored clock signals. Phase detector circuit 130 varies the value or values of the phase detection signals PDS based on any change in which of the two or more monitored clock signals A-F is leading the phases of the other monitored clock signals. Phase detection signals PDS are provided through medium 111 to PLL/DLL circuit 104. Phase detection signals PDS may be provided to PLL/DLL circuit 104 through a bus.

PLL/DLL circuit 104 determines if there is any clock skew between two or three of clock signals CK1, CK2, and CK3 based on the value or values of the one or more phase detection signals PDS. PLL/DLL circuit 104 makes an adjustment to the phase and/or frequency of one or more of clock signals CK1, CK2, or CK3 based on any clock skew indicated by the one or more phase detection signals PDS. After the phase or frequency adjustment, PLL/DLL circuit 104 can make another evaluation to determine if a further phase or frequency adjustment to one or more of clock signals CK1, CK2, or CK3 is required and in which direction. PLL/DLL circuit 104 may continue to adjust the phase and/or frequency of one or more of clock signals CK1, CK2, or CK3, until the one or more phase detection signals PDS indicate that the corresponding monitored clock signals A, B, C, D, E, and/or F do not have a clock skew. Phase detector 130 may then either lock in the phase for static operation or allow for run-time continual phase adjustment. These phase adjustments may either settle during startup or remain active during circuit operation. The logic circuitry that controls the adjustments to the phases/frequencies of signals CK1-CK3 may either be located in phase detector 130, or phase detector 130 may route signals to a separate control circuit, such as a state machine or CPU, which in turn controls the various delay elements in PLL/DLL circuit 104.

In some embodiments, clock signals CK1, CK2, and CK3 are intended to be aligned in phase. In these embodiments, any deviation from the intended zero phase offsets between clock signals CK1-CK3 is a clock skew that is compensated for by the circuitry shown in FIG. 1. As an example, if clock signals CK1-CK3 are intended to be aligned in phase, and if phase detection signals PDS indicate a first one of the monitored clock signals A-F is leading a second one of the monitored clock signals A-F from different ones of clock networks 141-143, PLL/DLL circuit 104 makes a corresponding adjustment to the phase and/or frequency of a corresponding one of clock signals CK1-CK3, until signals PDS indicate that the second one of the monitored clock signals is leading the first one of the monitored clock signals.

In other embodiments, clock signals CK1, CK2, and CK3 may be intended to have non-zero phase offsets. In these embodiments, any deviation from the intended non-zero phase offsets between clock signals CK1-CK3 is a clock skew that is compensated for by the circuitry shown in FIG. 1. For example, PLL/DLL circuit 104 may generate 10° incremental phase offsets in its output clock signals, such that clock signals CK1, CK2, and CK3 have relative phase offsets of 0°, 10°, and 20°, respectively, for the purpose of providing more setup or hold time margin for registers. In this embodiment, phase detector 130 detects when the input clock signals are aligned with high precision, and then communicates to the PLL or DLL 104 via signals PDS to indicate to the PLL/DLL 104 to adjust clock signals CLK1-CLK3 10° away from phase alignment. In this example, PLL/DLL circuit 104 makes corresponding adjustments to the phases and/or frequencies of clock signals CK1, CK2, and/or CK3 to cause the phases of clock signals CK1-CK3 to have the intended phase relationship of 0°, 10°, and 20°, respectively.

PLL/DLL circuit 104 may adjust the phases and/or frequencies of clock signals CK1-CK3 in response to changes in the values of phase detection signals PDS in one of multiple different ways. For example, if a VCO in PLL/DLL circuit 104 is a ring oscillator circuit that generates multiple output clock signals having different phase relationships at different tap points of the ring oscillator, PLL/DLL circuit 104 may adjust the phase of one or more of clock signals CK1-CK3 by changing the tap point or tap points of the ring oscillator at which one or more of clock signals CK1-CK3 are generated. As another example, if PLL/DLL circuit 104 includes counter circuits that divide the frequencies of clock signals to generate clock signals CK1-CK3, PLL/DLL circuit 104 may adjust the frequency or frequencies of one or more of clock signals CK1-CK3 by changing the frequency division ratio or ratios of a corresponding one or more of the counter circuits. As yet another example, PLL/DLL circuit 104 may adjust the phase or phases of one or more of clock signals CK1-CK3 by changing the frequency division ratio or ratios of a corresponding one or more of the counter circuits only for a brief period of time.

According to other embodiments, one or more additional phase detector circuits may be located in other regions of IC 120. The one or more additional phase detector circuits may compare phases of clock signals from different leaf nodes in clock networks 141-143 to generate additional phase detection signals that are provided to PLL/DLL circuit 104, as described above with respect to phase detector circuit 130. According to still other embodiments, phase detector circuit 130 may be located in a different region of IC 120 and may compare clock signals from different leaf nodes of clock networks 141-143 than the leaf nodes identified in FIG. 1 to generate phase detection signals PDS.

Figure 2:
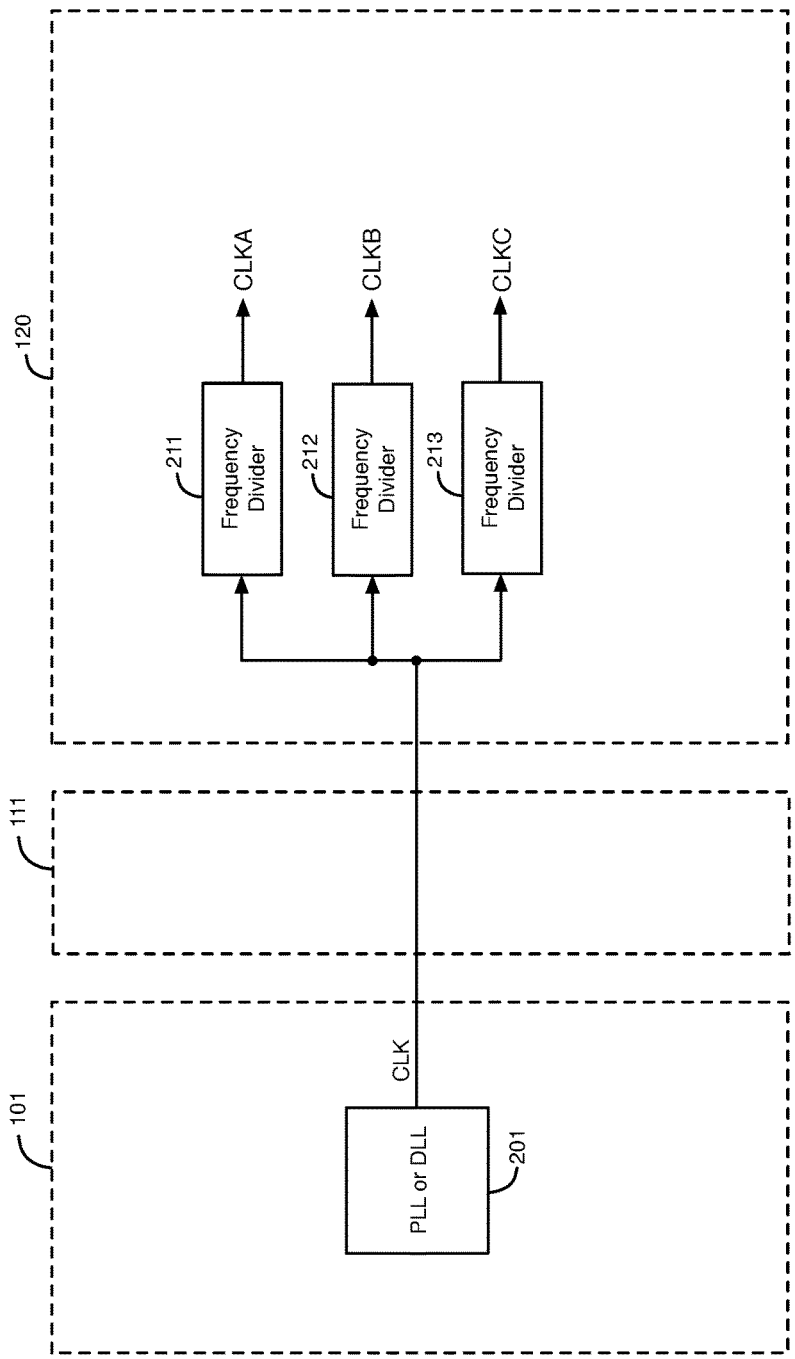
FIG. 2 illustrates an example of a circuit system that adjusts clock skew between multiple clock signals in an integrated circuit using frequency divider circuits, according to an embodiment.

FIG. 2 illustrates an example of a circuit system that adjusts clock skew between multiple clock signals in an integrated circuit using frequency divider circuits, according to an embodiment. The circuit system of FIG. 2 includes integrated circuit (IC) die 101, medium 111, and integrated circuit (IC) die 120. IC 101 also includes a circuit 201. Circuit 201 may be a phase-locked loop (PLL) or a delay-locked loop (DLL) in the embodiment of FIG. 2 (also referred to herein as PLL/DLL circuit 201). IC 120 includes three frequency divider circuits 211, 212, and 213 in the embodiment of FIG. 2. Frequency divider circuits 211-213 may, for example, be implemented using counter circuits.

As discussed above with respect to the embodiment of FIG. 1, clock signals CK1-CK3 may develop clock skew relative to each other while clock signals CK1-CK3 are being transmitted through conductors having different properties in medium 111 that are caused, for example, by chip-by-chip manufacturing variations. In the embodiment of FIG. 2, PLL/DLL circuit 201 generates only a single output clock signal CLK that is provided to IC 120 through conductors in medium 111. Thus, PLL/DLL circuit 201 does not generate multiple clock signals that may have clock skew relative to each other when the clock signals are received by IC 120.

In the embodiment of FIG. 2, clock signal CLK is provided from PLL/DLL 201 through medium 111 to an input of each of frequency divider circuits 211-213. Frequency divider circuits 211, 212, and 213 divide the frequency of clock signal CLK by three different frequency divider ratios to generate the frequencies of their respective output clock signals CLKA, CLKB, and CLKC. As an example that is not intended to be limiting, frequency divider circuits 211, 212, and 213 may divide the frequency of clock signal CLK by 4, 2, and 1 to generate the frequencies of clock signals CLKA, CLKB, and CLKC, respectively. Thus, in the embodiment of FIG. 2, medium 111 does not cause clock skew in clock signals generated by PLL/DLL circuit 201, because only a single clock signal CLK is transmitted through medium 111 that is then divided into multiple clock signals CLKA-CLKC using frequency divider circuits 211-213 in IC 120.

Figure 3:
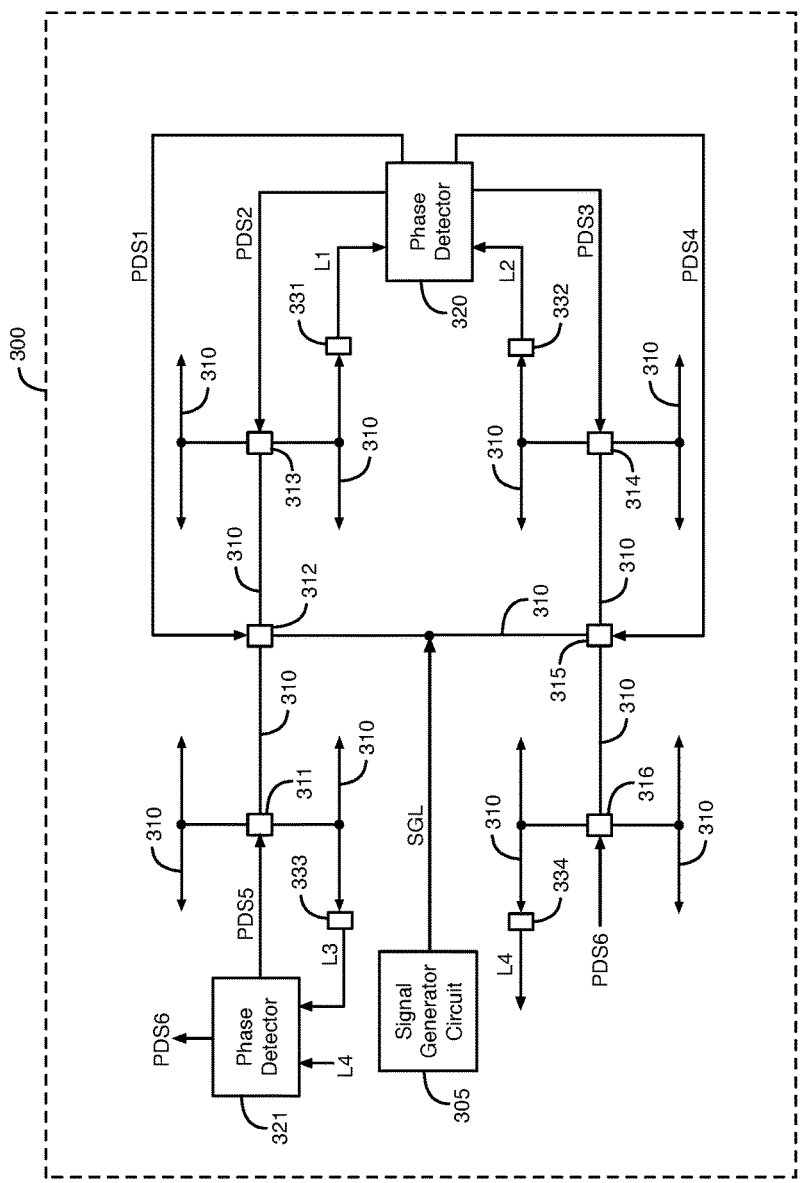
FIG. 3 illustrates an example of an integrated circuit that adjusts skew between signals provided through a signal network in the integrated circuit, according to an embodiment.

FIG. 3 illustrates an example of an integrated circuit 300 that adjusts skew between signals provided through a signal network in the integrated circuit, according to an embodiment. FIG. 3 shows an integrated circuit (IC) 300 that includes a signal generator circuit 305, a signal network 310, and phase detector circuits 320-321. IC 300 may be any type of IC, such as an FPGA or a processor IC. Signal generator circuit 305 may be, for example, a phase-locked loop (PLL) circuit, a delay-locked loop (DLL) circuit, an oscillator circuit, a reset signal generator circuit, or a strobe signal generator circuit. Signal generator circuit 305 generates an output signal SGL that is provided to signal network 310. Signal generator circuit 305 may generate signal SGL as, for example, a clock signal, a reset signal, or a strobe signal. Signal SGL may be, for example, a repeating periodic signal, a signal that has a temporary periodic waveform such as a strobe signal, or a signal that has a training pattern.

Signal network 310 is configured as an H-tree in the example of FIG. 3. However, the techniques disclosed herein with respect to FIG. 3 can be used with signal networks having other types of architectures and configurations. Signal network 310 may be, for example, a clock network that distributes a clock signal, a reset network that distributes a reset signal, or a strobe network that distributes a strobe signal.

Signal network 310 includes adjustable delay circuits 311, 312, 313, 314, 315, and 316 that are coupled at intersections of the branches of signal network 310 as shown in FIG. 3. It should be noted that in some embodiments, only a subset of the delay circuits 311-316 shown in FIG. 3 may be implemented in an integrated circuit. Adjustable delay circuits 311-316 may be any types of variable delay circuits. As examples that are not intended to be limiting, adjustable delay circuits 311-316 may be programmable delay lines that each include a series of small to larger buffers that are multiplexed by a multiplexer, or that each include shorter and longer metal paths that are multiplexed by a multiplexer. The branches of signal network 310 include conductors (i.e., wires). The intersections of the branches of signal network 310 may also include multiplexer circuits and buffer circuits (not shown).

Signal SGL is provided through the branches of signal network 310 and through the adjustable delay circuits 311-316 to leaf nodes at the endpoints of signal network 310, including 4 exemplary leaf nodes 331-334 shown in FIG. 3. Signal SGL may be provided from the leaf nodes of signal network 310 to various circuit blocks (not shown) in IC 300, such as registers, latches, memory circuits, etc. As signal SGL is provided through signal network 310, the signal SGL in one branch of signal network 310 may develop skew relative to the signal SGL in another branch of signal network 310. This skew could be caused by a local manufacturing variation, e.g., different metallization or buffer sizing that cannot be compensated for with a static solution. The skew generated in different branches of signal network 310 may cause the signals received at different leaf nodes of signal network 310 to have skew relative to each other. Skew between signals received at the leaf nodes of signal network 310 may be undesirable for a variety of reasons. For example, if clock signals are provided through network 310, skew between the clock signals as received at the leaf nodes of network 310 may cause register circuits coupled to the leaf nodes of network 310 to malfunction if the setup and hold constraints of the register circuits are not satisfied.

The signals SGL as received at the leaf nodes 331-332 are identified as signals L1 and L2, respectively, in FIG. 3. Signals L1 and L2 are provided from leaf nodes 331-332 to inputs of phase detector circuit 320. Phase detector circuit 320 compares the phases of signals L1 and L2 to generate 4 sets of phase detection signals PDS1, PDS2, PDS3, and PDS4. Phase detector circuit 320 may cause the phase detection signals PDS1-PDS4 to indicate a phase offset between the two signals L1 and L2. Phase detector 320 causes the phase detection signals PDS1-PDS4 to indicate which of the two signals L1 or L2 has a phase that is leading the phase of the other signal. Phase detector circuit 320 varies one or more sets of the phase detection signals PDS1-PDS4 to indicate any change in which of the two signals L1 or L2 is leading the phase of the other signal. As an example, phase detector 320 may adjust one or more of the PDS1-PDS4 signals in response to a change from the phase of signal L1 leading the phase of signal L2 to the phase of signal L2 now leading the phase of signal L1.

The phase detection signals PDS1, PDS2, PDS3, and PDS4 are provided to control inputs of adjustable delay circuits 312, 313, 314, and 315, respectively. Adjustable delay circuits 312-315 adjust the delay provided to their output signals in signal network 310 relative to their input signals in signal network 310 based on changes in the respective sets of phase detection signals PDS1-PDS4. For example, if phase detector circuit 320 detects a skew between signals L1 and L2 (e.g., the phase of one of signals L1 or L2 is leading the phase of the other signal), phase detector circuit 320 may adjust signals PDS1 and/or signals PDS2 to change the delay provided by adjustable delay circuits 312 and/or 313, respectively, to signal L1 in order to reduce the skew between signals L1 and L2. Phase detector circuit 320 may also or alternatively adjust signals PDS3 and/or signals PDS4 to change the delay provided by adjustable delay circuits 314 and/or 315 to signal L2 in order to reduce the skew between signals L1 and L2.

The signals SGL as received at the leaf nodes 333-334 of signal network 310 are identified as signals L3 and L4, respectively, in FIG. 3. Signals L3 and L4 are provided from leaf nodes 333-334, respectively, to inputs of phase detector circuit 321. Phase detector circuit 321 compares the phases of signals L3 and L4 to generate 2 sets of phase detection signals PDS5 and PDS6. Phase detector circuit 321 causes the phase detection signals PDS5-PDS6 to indicate which of the two signals L3 or L4 has a phase that is leading the phase of the other signal. Phase detector circuit 321 varies the value or values of one or both sets of the phase detection signals PDS5-PDS6 to indicate any change in which of the two signals L3 or L4 is leading the phase of the other signal. As an example, phase detector 321 may adjust one or more of the PDS5-PDS6 signals in response to a change from the phase of signal L3 leading the phase of signal L4 to the phase of signal L4 leading the phase of signal L3.

The phase detection signals PDS5-PDS6 are provided to control inputs of adjustable delay circuits 311 and 316, respectively. Adjustable delay circuits 311 and 316 adjust the delay provided to their output signals in signal network 310 relative to their input signals in signal network 310 based on changes in the respective sets of phase detection signals PDS5-PDS6. For example, if phase detector circuit 321 detects a skew between signals L3 and L4 (e.g., the phase of one of signals L3 or L4 is leading the phase of the other signal), phase detector circuit 321 may adjust signals PDS5 to change the delay provided by adjustable delay circuit 311 to signal L3 in order to reduce the skew between signals L3 and L4. Phase detector circuit 321 may also or alternatively adjust signals PDS6 to change the delay provided by adjustable delay circuit 316 to signal L4 in order to reduce the skew between signals L3 and L4.

Figure 4:
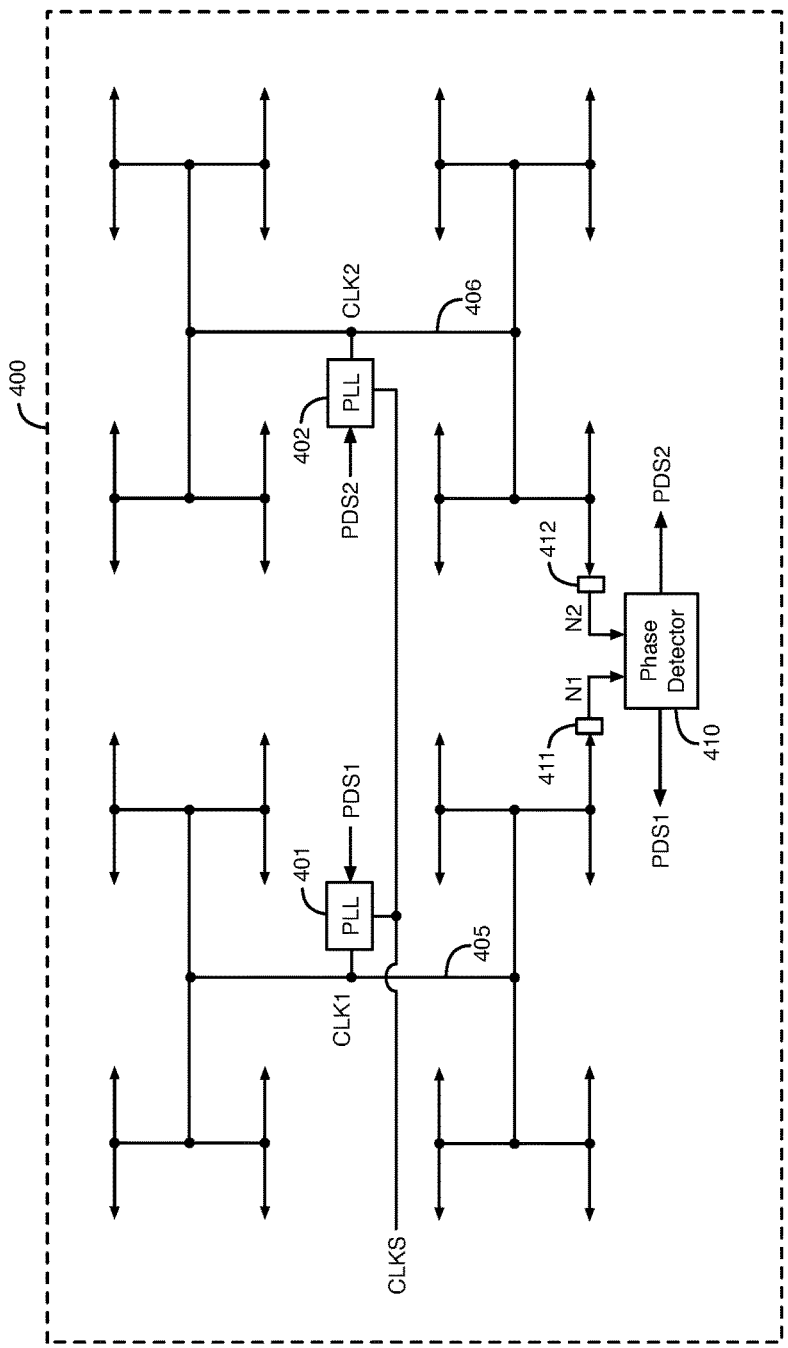
FIG. 4 illustrates an example of an integrated circuit having two phase-locked loop circuits that are coupled to two clock networks, according to an embodiment.

FIG. 4 illustrates an example of an integrated circuit 400 having two phase-locked loop circuits that are coupled to two clock networks, according to an embodiment. Such a circuit may be used, for example, in order to limit the distribution of a given clock signal in order to provide better clock jitter or duty cycle correction characteristics. FIG. 4 shows an integrated circuit 400 that includes two phase-locked loop (PLL) circuits 401-402, two clock networks 405-406, and a phase detector circuit 410. IC 400 may be any type of IC, such as an FPGA or a processor IC. A periodic clock signal CLKS is provided to inputs of PLL circuits 401 and 402 as shown in FIG. 4. Clock signal CLKS may, for example, be generated off-chip and provided to IC 400.

PLL circuits 401 and 402 generate output clock signals CLK1 and CLK2, respectively, in response to input clock signal CLKS. Clock signal CLK1 is distributed through the branches of clock network 405 to leaf nodes at the endpoints of clock network 405. As an example, clock signal CLK1 is distributed through clock network 405 to leaf node 411. Clock signal CLK2 is distributed through the branches of clock network 406 to leaf nodes at the endpoints of clock network 406. As an example, clock signal CLK2 is distributed through clock network 406 to leaf node 412. In the embodiment of FIG. 4, clock networks 405-406 are configured as H-tree clock networks. However, the techniques disclosed herein with respect to FIG. 4 may be used with clock networks having other types of architectures.

The clock signals CLK1 and CLK2 as received at leaf nodes 411 and 412 are identified as signals N1 and N2, respectively, in FIG. 4. Signals N1 and N2 are provided from leaf nodes 411-412 to inputs of phase detector circuit 410. Phase detector circuit 410 compares the phases of signals N1 and N2 to generate 2 sets of phase detection signals PDS1-PDS2. Phase detector circuit 410 causes the phase detection signals PDS1-PDS2 to indicate which of the two signals N1 or N2 has a phase that is leading the phase of the other signal. Phase detector circuit 410 varies one or both sets of the phase detection signals PDS1-PDS2 to indicate any change in which of the two signals N1 or N2 is leading the phase of the other signal.

The phase detection signals PDS1-PDS2 are provided to control inputs of PLL circuits 401-402, respectively. PLL circuits 401 and 402 adjust the phases and/or frequencies of the respective clock signals CLK1 and CLK2 based on changes in the respective sets of phase detection signals PDS1-PDS2. For example, if phase detector circuit 410 detects a skew between signals N1 and N2 (e.g., the phase of one of signals N1 or N2 is leading the phase of the other signal), phase detector circuit 410 may adjust signals PDS1 to cause PLL circuit 401 to adjust the phase and/or frequency of clock signal CLK1 in order to reduce the skew between signals N1 and N2. Phase detector circuit 410 may also or alternatively adjust signals PDS2 to cause PLL circuit 402 to adjust the phase and/or frequency of clock signal CLK2 in order to reduce the skew between signals N1 and N2.

PLL circuits 401-402 may adjust the phases of clock signals CLK1-CLK2 by changing the tap points of ring oscillators at which the clock signals CLK1-CLK2 are generated in response to changes in signals PDS1-PDS2, respectively. In another embodiment, PLL circuits 401-402 may adjust the frequencies or phases of clock signals CLK1-CLK2 by changing the frequency division ratios of counter circuits in response to changes in signals PDS1-PDS2, respectively, as described above with respect to FIG. 1.

The embodiments disclosed herein with respect to FIGS. 1-4 are not mutually exclusive to one another. Two or more of the embodiments of FIGS. 1-4 may be used together in the same system or IC die. For example, the embodiments of FIGS. 1 and 2 may be used in the same circuit system. As another example, the circuitry shown in FIGS. 3 and 4 may be used together in the same IC die. As yet another example, the circuitry shown in FIG. 3 may be used in IC 120 with the circuitry shown in FIG. 1 or FIG. 2. As still another example, the circuitry shown in FIG. 4 may be used in IC 120 with the circuitry shown in FIG. 1 or FIG. 2.

Figure 5:
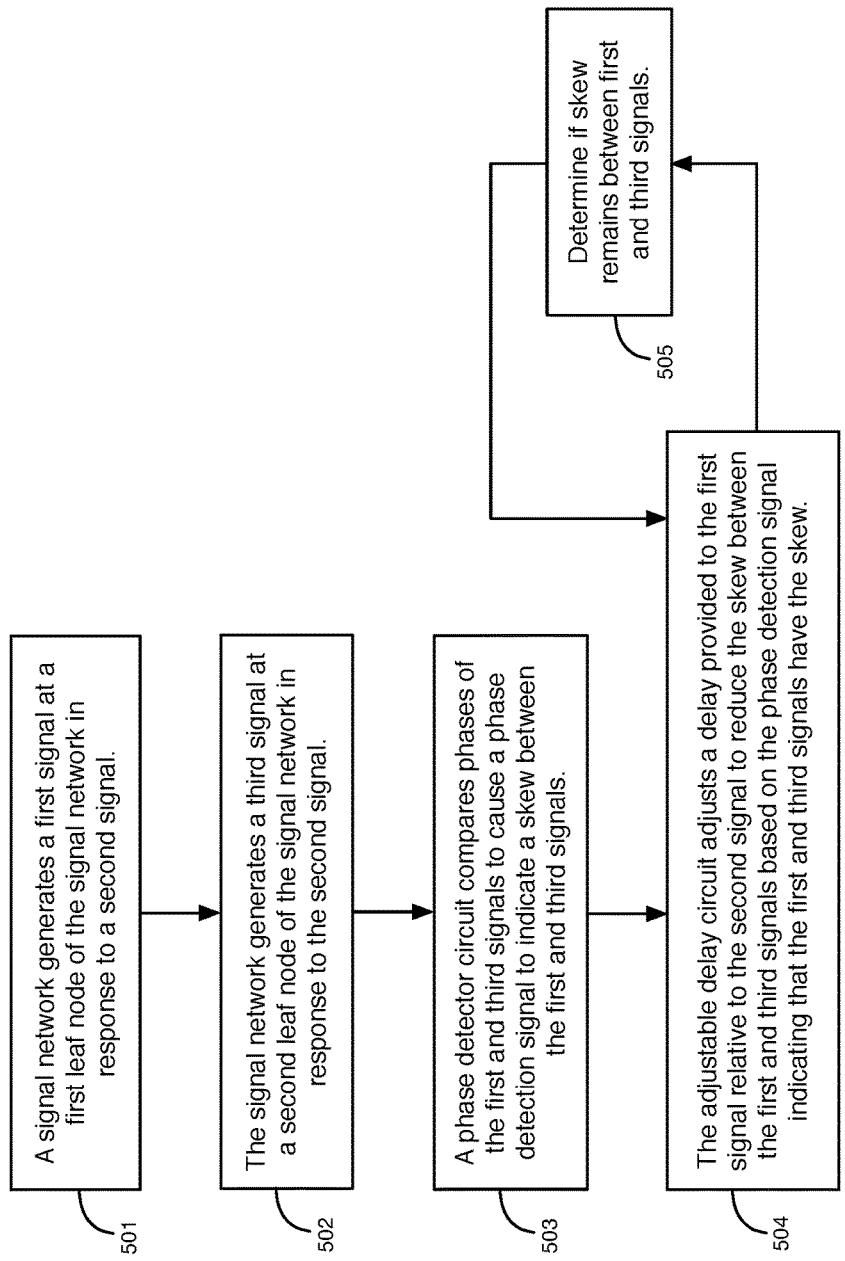
FIG. 5 illustrates examples of operations for reducing skew in a signal network, according to an embodiment.

FIG. 5 illustrates examples of operations for reducing skew in a signal network, according to an embodiment. In operation 501, the signal network generates a first signal at a first leaf node of the signal network in response to a second signal. In operation 502, the signal network generates a third signal at a second leaf node of the signal network in response to the second signal. In operation 503, a phase detector circuit compares phases of the first and third signals to cause a phase detection signal to indicate a skew between the first and third signals. The signal network comprises an adjustable delay circuit that is coupled at an intersection of the signal network between branches of the signal network. In operation 504, the adjustable delay circuit adjusts a delay provided to the first signal relative to the second signal to reduce the skew between the first and third signals based on the phase detection signal indicating that the first and third signals have the skew. In operation 505, the phase detector circuit determines if skew remains between the first and third signals. If the phase detector determines that skew remains between the first and third signals in operation 505, operation 504 is repeated until the skew is eliminated or reduced below an error margin. As an example, the phase detector may cause the phase detection signal to indicate that the phase of the first signal is leading the phase of the third signal. The adjustable delay circuit may continue to adjust the delay provided to the first signal, until the phase detector causes the phase detection signal to indicate that the phase of the third signal is leading the phase of the first signal.

According to some embodiments, a method for a circuit system comprises generating a first clock signal at a first leaf node of a first clock network in response to a second clock signal; generating a third clock signal at a second leaf node of a second clock network in response to a fourth clock signal; comparing phases of the first and third clock signals to generate a phase detection signal using a phase detector circuit; generating the second and fourth clock signals using a phase-locked or delay-locked loop circuit; and adjusting a phase of the second clock signal using the phase-locked or delay-locked loop circuit to reduce a clock skew between the first and third clock signals based on the phase detection signal indicating that the first and third clock signals have the clock skew.

The methods and apparatuses disclosed herein may be incorporated into any suitable electronic device or system of electronic devices. For example, the methods and apparatuses may be incorporated into numerous types of devices, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits described herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit system comprising:
a first clock network that generates a first clock signal at a first leaf node of the first clock network in response to a second clock signal;
a second clock network that generates a third clock signal at a second leaf node of the second clock network in response to a fourth clock signal, wherein the first and second clock networks are overlapping H-tree clock networks;
a phase detector circuit that compares phases of the first and third clock signals to generate a first phase detection signal; and
a phase-locked or delay-locked loop circuit that generates the second and fourth clock signals, wherein the phase-locked or delay-locked loop circuit adjusts a phase of the second clock signal to reduce a clock skew between the first and third clock signals based on the first phase detection signal indicating that the first and third clock signals have the clock skew.

2. The circuit system of claim 1 further comprising:
a first frequency divider circuit that generates a fifth clock signal in response to a sixth clock signal; and
a second frequency divider circuit that generates a seventh clock signal in response to the sixth clock signal, wherein the first and second frequency divider circuits are in an integrated circuit, and wherein the sixth clock signal is generated outside the integrated circuit and provided to inputs of the first and second frequency divider circuits.

3. The circuit system of claim 1, wherein the circuit system comprises first and second integrated circuits, wherein the first integrated circuit comprises the first and second clock networks and the phase detector circuit, and wherein the second integrated circuit comprises the phase-locked or delay-locked loop circuit.

4. The circuit system of claim 1, wherein the circuit system further comprises a medium, and wherein the second and fourth clock signals and the first phase detection signal are provided through conductors in the medium.

5. The circuit system of claim 1 further comprising:
a third clock network that generates a fifth clock signal at a third leaf node of the third clock network in response to a sixth clock signal, wherein the phase-locked or delay-locked loop circuit generates the sixth clock signal, wherein the first, second, and third clock networks are overlapping H-tree clock networks,
wherein the phase detector circuit compares phases of the first and fifth clock signals to generate a second phase detection signal, and wherein the phase-locked or delay-locked loop circuit adjusts a phase of the sixth clock signal to reduce a clock skew between the first and fifth clock signals based on the second phase detection signal indicating that the first and fifth clock signals have the clock skew.

6. The circuit system of claim 5, wherein the phase detector circuit compares phases of the third and fifth clock signals to generate a third phase detection signal, and wherein the phase-locked or delay-locked loop circuit adjusts a phase of the fourth clock signal to reduce a clock skew between the third and fifth clock signals based on the third phase detection signal indicating that the third and fifth clock signals have the clock skew.

7. The circuit system of claim 1, wherein the first clock network generates a fifth clock signal at a third leaf node of the first clock network in response to the second clock signal,
wherein the second clock network generates a sixth clock signal at a fourth leaf node of the second clock network in response to the fourth clock signal,
wherein the phase detector circuit compares phases of the fifth and sixth clock signals to generate a second phase detection signal, and
wherein the phase-locked or delay-locked loop circuit adjusts a phase of the second clock signal to reduce a clock skew between the fifth and sixth clock signals based on the second phase detection signal indicating that the fifth and sixth clock signals have the clock skew.

8. The circuit system of claim 7, wherein the phase detector circuit compares phases of the third and fifth clock signals to generate a third phase detection signal, and wherein the phase-locked or delay-locked loop circuit adjusts a phase of the second clock signal to reduce a clock skew between the third and fifth clock signals based on the third phase detection signal indicating that the third and fifth clock signals have the clock skew.

9. A method comprising:
generating a first clock signal at a first leaf node of a first clock network in response to a second clock signal;
generating a third clock signal at a second leaf node of a second clock network in response to a fourth clock signal, wherein the first and second clock networks are overlapping H-tree clock networks;
generating the second and fourth clock signals using a phase-locked or delay-locked loop circuit;
comparing phases of the first and third clock signals to generate a first phase detection signal using a phase detector circuit; and
adjusting a phase of the second clock signal using the phase-locked or delay-locked loop circuit to reduce a clock skew between the first and third clock signals based on the first phase detection signal indicating that the first and third clock signals have the clock skew.

10. The method of claim 9, wherein the first and second clock networks and the phase detector circuit are in a first integrated circuit, and wherein the phase-locked or delay-locked loop circuit is in a second integrated circuit.

11. The method of claim 10, wherein the second and fourth clock signals and the first phase detection signal are provided through conductors in a medium in a circuit system.

12. The method of claim 9 further comprising:
generating a fifth clock signal at a third leaf node of a third clock network in response to a sixth clock signal;
generating the sixth clock signal using the phase-locked or delay-locked loop circuit, wherein the first, second, and third clock networks are overlapping H-tree clock networks;
comparing phases of the first and fifth clock signals to generate a second phase detection signal using the phase detector circuit; and
adjusting a phase of the sixth clock signal using the phase-locked or delay-locked loop circuit to reduce a clock skew between the first and fifth clock signals based on the second phase detection signal indicating that the first and fifth clock signals have the clock skew.

13. The method of claim 12 further comprising:
comparing phases of the third and fifth clock signals to generate a third phase detection signal using the phase detector circuit; and
adjusting a phase of the fourth clock signal using the phase-locked or delay-locked loop circuit to reduce a clock skew between the third and fifth clock signals based on the third phase detection signal indicating that the third and fifth clock signals have the clock skew.

14. The method of claim 9 further comprising:
generating a fifth clock signal at a third leaf node of the first clock network in response to the second clock signal;
generating a sixth clock signal at a fourth leaf node of the second clock network in response to the fourth clock signal;
comparing phases of the fifth and sixth clock signals to generate a second phase detection signal using the phase detector circuit; and
adjusting a phase of the second clock signal using the phase-locked or delay-locked loop circuit to reduce a clock skew between the fifth and sixth clock signals based on the second phase detection signal indicating that the fifth and sixth clock signals have the clock skew.

15. The method of claim 14 further comprising:
comparing phases of the third and fifth clock signals to generate a third phase detection signal using the phase detector circuit; and
adjusting a phase of the second clock signal using the phase-locked or delay-locked loop circuit to reduce a clock skew between the third and fifth clock signals based on the third phase detection signal indicating that the third and fifth clock signals have the clock skew.

* * * * *